US012610476B2

(12) United States Patent　　　　(10) Patent No.:　US 12,610,476 B2

Weng　　　　　　　　　　　　　　　(45) Date of Patent:　　Apr. 21, 2026

(54) MEMORY MODULE

(71) Applicant: TOPROOT TECHNOLOGY CORPORATION LIMITED., New Taipei (TW)

(72) Inventor: Jung-Yuan Weng, New Taipei (TW)

(73) Assignee: TOPROOT TECHNOLOGY CORPORATION LIMITED., New Taipei (TW)

(*) Notice: Subject to any disclaimer, the term of this patent is extended or adjusted under 35 U.S.C. 154(b) by 65 days.

(21) Appl. No.: 18/120,464

(22) Filed: Mar. 13, 2023

(65) Prior Publication Data

US 2024/0064913 A1　　　Feb. 22, 2024

(30) Foreign Application Priority Data

Aug. 16, 2022　(TW) .................................. 111130839

(51) Int. Cl.
　H05K 5/00　　　　　(2025.01)
(52) U.S. Cl.
　CPC .................................. H05K 5/0069 (2013.01)
(58) Field of Classification Search
　CPC . H01R 13/62938; G06F 1/187; G11B 33/128;
　　　　　　　　　　　　　　　　　　　　H05K 5/0069
　See application file for complete search history.

(56) References Cited

U.S. PATENT DOCUMENTS

| | | | | |
|---|---|---|---|---|
| 6,078,504 A | * | 6/2000 | Miles | ....................... G06F 1/184 |
| | | | | 361/752 |
| 6,122,163 A | * | 9/2000 | Stone | ................... G11B 33/124 |
| 7,667,985 B1 | * | 2/2010 | Tamarkin | ............. H05K 7/1487 |
| | | | | 29/830 |
| 9,585,270 B2 | * | 2/2017 | Yang | ......................... G06F 1/18 |
| 9,847,103 B1 | * | 12/2017 | Chen | .................... G11B 33/124 |
| 10,346,735 B1 | * | 7/2019 | Lee | ............................ G06F 1/00 |
| 2015/0115122 A1 | * | 4/2015 | Townsend, Jr. | ........ F16M 13/02 |
| | | | | 248/317 |
| 2019/0101963 A1 | * | 4/2019 | Chang | ................ G11B 33/1413 |
| 2019/0215972 A1 | * | 7/2019 | Jang | ......................... G06F 1/16 |
| 2021/0026414 A1 | * | 1/2021 | Lau | ..................... H05K 7/2049 |

FOREIGN PATENT DOCUMENTS

| | | |
|---|---|---|
| CN | 109116931 A | 1/2019 |
| TW | M494947 U | 2/2015 |
| TW | 201626136 A | 7/2016 |
| TW | M614369 U | 7/2021 |
| TW | 202131567 A | 8/2021 |

* cited by examiner

*Primary Examiner* — Allen L Parker

*Assistant Examiner* — Peter Krim

(74) *Attorney, Agent, or Firm* — Troutman Pepper Locke LLP; Tim Tingkang Xia, Esq.

(57)　　　　　　　　ABSTRACT

The present invention provides a memory module for use in a computing device. The computing device comprises a case, a mainboard and a connector, the case has an installation opening, and the memory module comprises: an accommodating device connected to the mainboard and the case; and a memory device detachably disposed on the accommodating device through the installation opening and connected to the connector. With the memory module of the invention, the memory device can be detached from or connected to the connector.

14 Claims, 7 Drawing Sheets

MEMORY MODULE

CROSS-REFERENCE TO RELATED APPLICATIONS

This non-provisional application claims priority under 35 U.S.C. § 119(a) on Patent Application No(s). 111130839 filed in Taiwan on Aug. 16, 2022, the entire contents of which are hereby incorporated by reference.

FIELD OF THE INVENTION

The present disclosure relates to a memory module, and more particularly, to a memory module that can connect memory to a computing device in a detachable (or separable) manner.

DESCRIPTION OF THE PRIOR ART

Conventional memory (such as, but not limited to, M.2 SSD) used in a computing device (such as, but not limited to, a computer, laptop, mobile device or server) is typically fixed on that computing device. However, such a design is likely to cause inconvenience to users. For example, when the memory is damaged and needs to be replaced, the user will need to remove the casing of the computing device before further removing the memory device and replacing the memory. In addition, with the conventional way of fixing the memory to a computing device, the user cannot remove, add or replace the memory at any time as needed. In view of the above, there exists a need for a memory module that can connect memory to a computing device in a detachable (or separable) manner, so that the user can remove, add or replace the memory as needed.

SUMMARY OF THE INVENTION

To address the problems described above, an object of the invention is to provide a memory module that can connect memory to a computing device in a detachable (or separable) manner.

To achieve the aforementioned object, the present invention provides a memory module for use in a computing device. The computing device comprises a case, a mainboard and a connector, the case has an installation opening, and the memory module comprises: an accommodating device connected to the mainboard and the case; and a memory device detachably disposed on the accommodating device through the installation opening and connected to the connector.

In a preferred embodiment, the accommodating device has a guiding portion, and the memory device moves relative to the accommodating device along the guiding portion and connects to the connector.

In a preferred embodiment, the accommodating device has an opening portion, and the connector passes through the opening portion so that the memory device is detachably connected to the connector.

In a preferred embodiment, the connector is disposed on the mainboard, and the case and the mainboard have a first angle between them, wherein the accommodating device has a first connecting portion and a second connecting portion, the first connecting portion connected to the case and the second connecting portion connected to the connector, and wherein the first connecting portion and the second connecting portion have a second angle between them, the second angle being smaller than the first angle.

In a preferred embodiment, the accommodating device has a first connecting portion disposed at least partially between the case and the mainboard, and the first connecting portion is connected to the case and the mainboard.

In a preferred embodiment, the first connecting portion has an abutting portion, and the first connecting portion is connected to the mainboard through the abutting portion.

In a preferred embodiment, the memory module further comprises a positioning mechanism, wherein the memory module enables the memory device to move relative to the accommodating device in a moving direction by using the positioning mechanism.

In a preferred embodiment, the positioning mechanism is made up of: the memory device has a guiding slot and the accommodating device has a positioning portion, wherein when the memory device moves relative to the accommodating device, the positioning portion moves in the moving direction along the guiding slot.

In a preferred embodiment, the memory device comprises a housing portion, and the guiding slot is formed on the housing portion.

In a preferred embodiment, the positioning mechanism is made up of: the memory device has a positioning portion and the accommodating device has a guiding slot, wherein when the memory device moves relative to the accommodating device, the positioning portion moves in the moving direction along the guiding slot.

In a preferred embodiment, the accommodating device comprises a securing mechanism, and the accommodating device and the case are secured to each other by means of the securing mechanism.

In a preferred embodiment, the securing mechanism is a screw mechanism, and the accommodating device is screwed to the case by means of the screw mechanism.

In a preferred embodiment, the case has a positioning hole, and the securing mechanism is made up of: the accommodating device has a securing portion at a first end portion, and the securing portion extends at least partially through the positioning hole.

In a preferred embodiment, the accommodating device has a protruding portion at a second end portion, and the protruding portion is connected to a positioning groove of the case.

In a preferred embodiment, the memory device comprises a housing portion, a heat conducting portion and a memory portion, the heat conducting portion and the memory portion disposed within the housing portion, and the heat conducting portion contacting the memory portion.

The foregoing and other aspects of the present invention will become more apparent from the following detailed description of the non-limiting examples and with reference to the accompanying drawings.

DETAILED DESCRIPTION OF THE PREFERRED EMBODIMENTS

The present invention will be described more fully hereinafter with reference to the accompanying drawings, and some embodiments are illustrated by way of example. However, the claimed subject matter may be embodied in various forms, and thus the construction of the claimed subject matter is not limited to any embodiments disclosed in this specification; the embodiments described for illustrative purposes are exemplary only. Similarly, the present invention is intended to provide a reasonably broad scope for the claimed subject matter that is covered herein.

Figure 1:
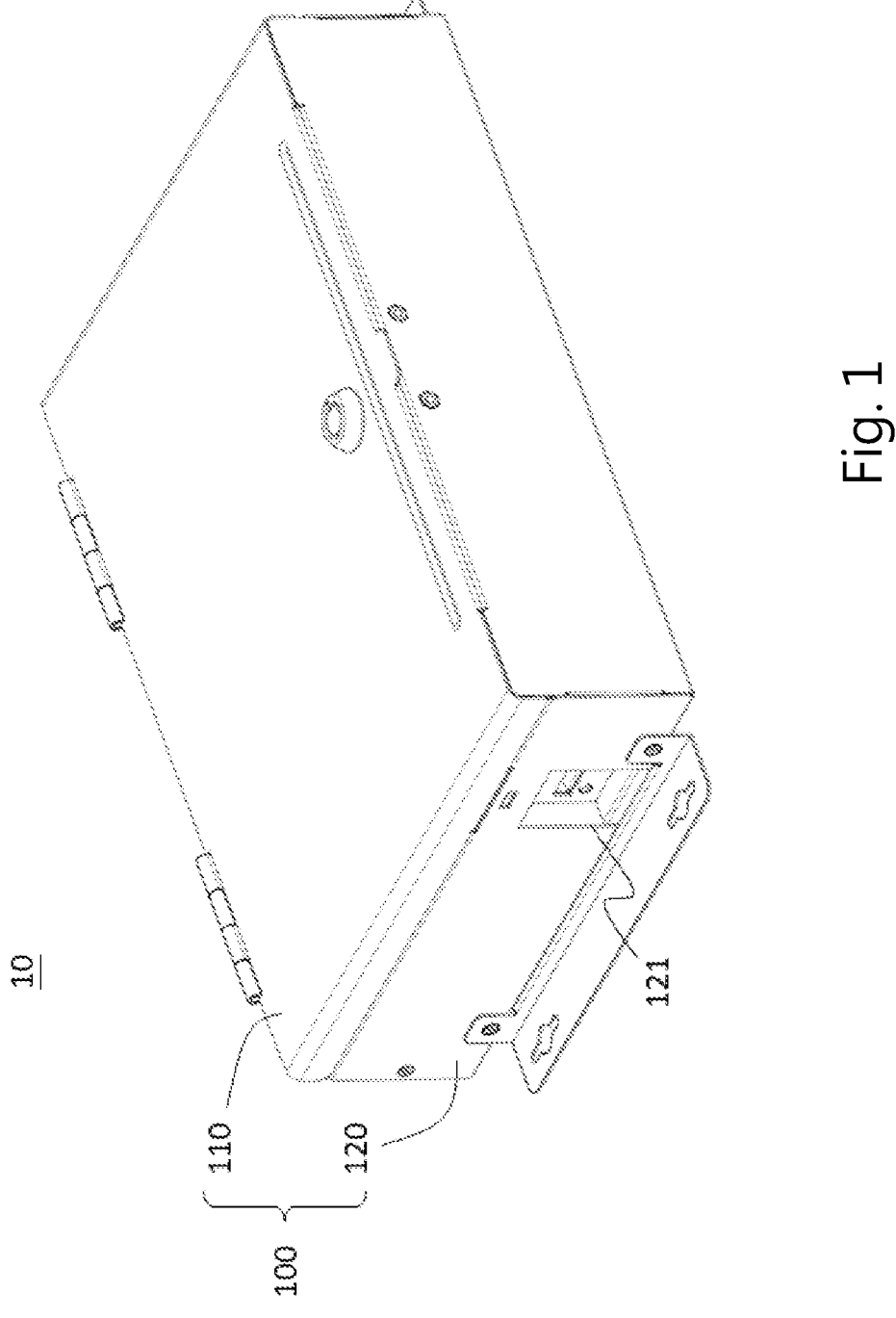
FIG. 1 is a schematic view showing a case of a computing device according to an embodiment of the invention.

Please refer to FIG. 1, which is a schematic view showing a case of a computing device according to an embodiment of the invention. In the embodiment depicted in FIG. 1, the memory module (or may be referred to as a memory system) of the present invention is used in a computing device 10, and the computing device 10 comprises a case 100. In a preferred embodiment of the invention, the case 100 may comprise an upper case 110, a lower case 120 and an installation opening 121. The upper case 110 is connected to the lower case 120, and the installation opening 121 may be provided on at least one of the upper case 110 and the lower case 120. It should be understood that the memory module of the present invention can be used in various types of computing devices. For example, the computing device 10 that comprises the memory module of the invention may be, but is not limited to, a computer, a laptop, a mobile device, or a server.

Figure 2:
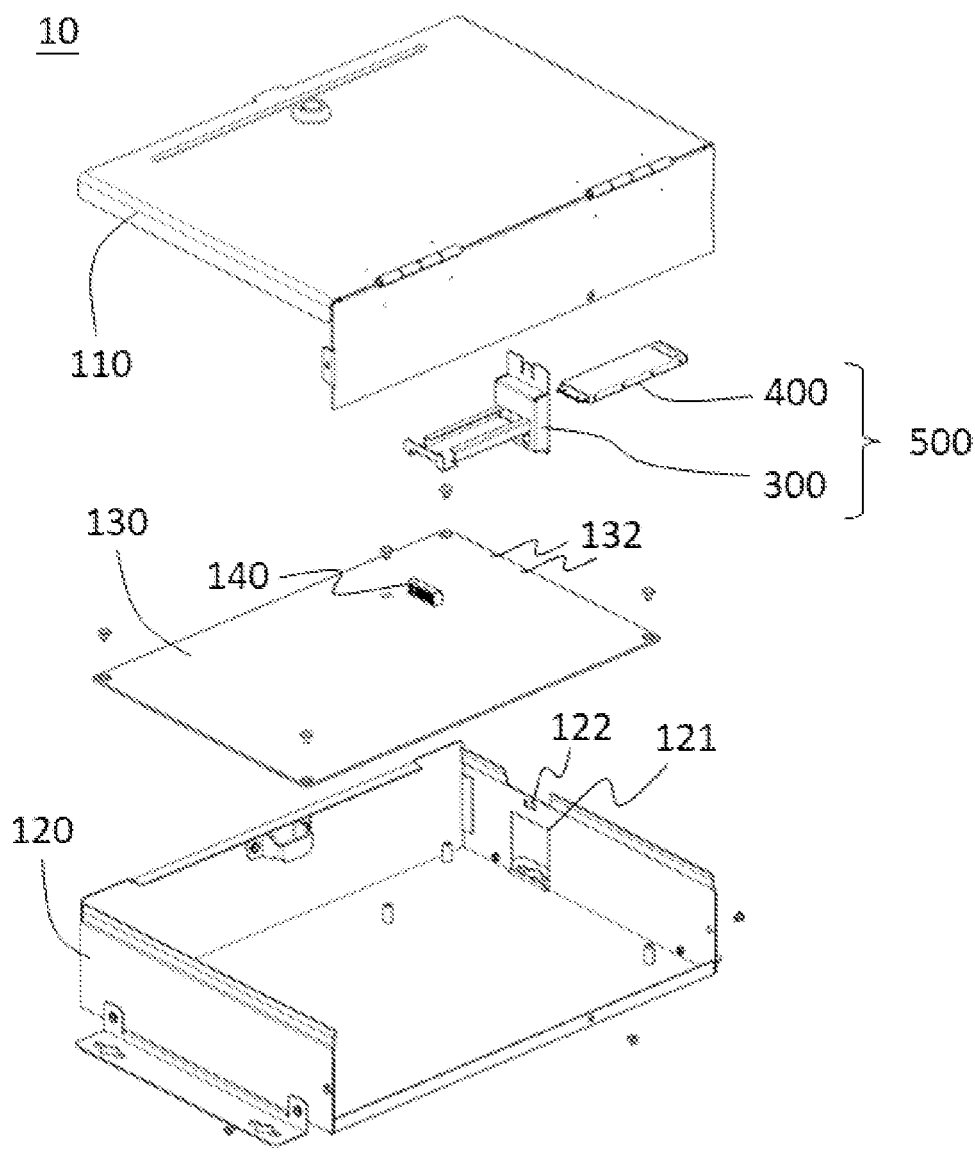
FIG. 2 is an exploded view showing an embodiment where a memory module of the invention is used in a computing device.

Please refer to FIG. 2, which is an exploded view showing an embodiment in which a memory module of the invention is used in the computing device. As the embodiment in FIG. 2 shows, the memory module 500 can be used in the computing device 10. The computing device 10 comprises a case (the case may comprise an upper case 110 and a lower case 120), a mainboard 130 and a connector 140, while the memory module 500 comprises an accommodating device 300 and a memory device 400 (or it can be regarded as a structure where the computing device 10 comprises the case, the mainboard 130, the connector 140 and the memory module 500). Preferably, the connector 140 can be disposed on the mainboard 130, and the connector 140 can be electrically connected to the memory device 400 in a detachable manner (for example, the connector 140 can be electrically connected to the memory section of the memory device 400 in a detachable manner). However, it should be understood that depending on the needs, the connector 140 may not be connected to the mainboard 130. In one embodiment, the mainboard 130 can be connected to the case of the computing device 10 (for example, the mainboard 130 can be provided within the case and connected to at least one of the upper case 110 and the lower case 120). In another embodiment, the mainboard 130 may be provided as a part of the case (i.e., the case comprises the mainboard 130); for example, the mainboard 130 may be the top surface, the bottom surface or the side surface of the case. In the embodiment shown in FIG. 2, the mainboard 130 comprises notch portions 132, wherein the notch portions 132 can be used for connecting the accommodating device 300, so as to have the accommodating device 300 disposed at a correct angle and/or a correct position. The case comprises the installation opening 121, and the memory device 400 can be detachably disposed on the accommodating device 300 through the installation opening 121 and connected to the connector 140. Preferably, the accommodating device 300 can be connected to the mainboard 130 and the case of the computing device 10. Preferably, the memory device 400 can be electrically connected to the connector 140, so that the computing device 10 can access the memory device 400 through the connector 140.

Figure 3:
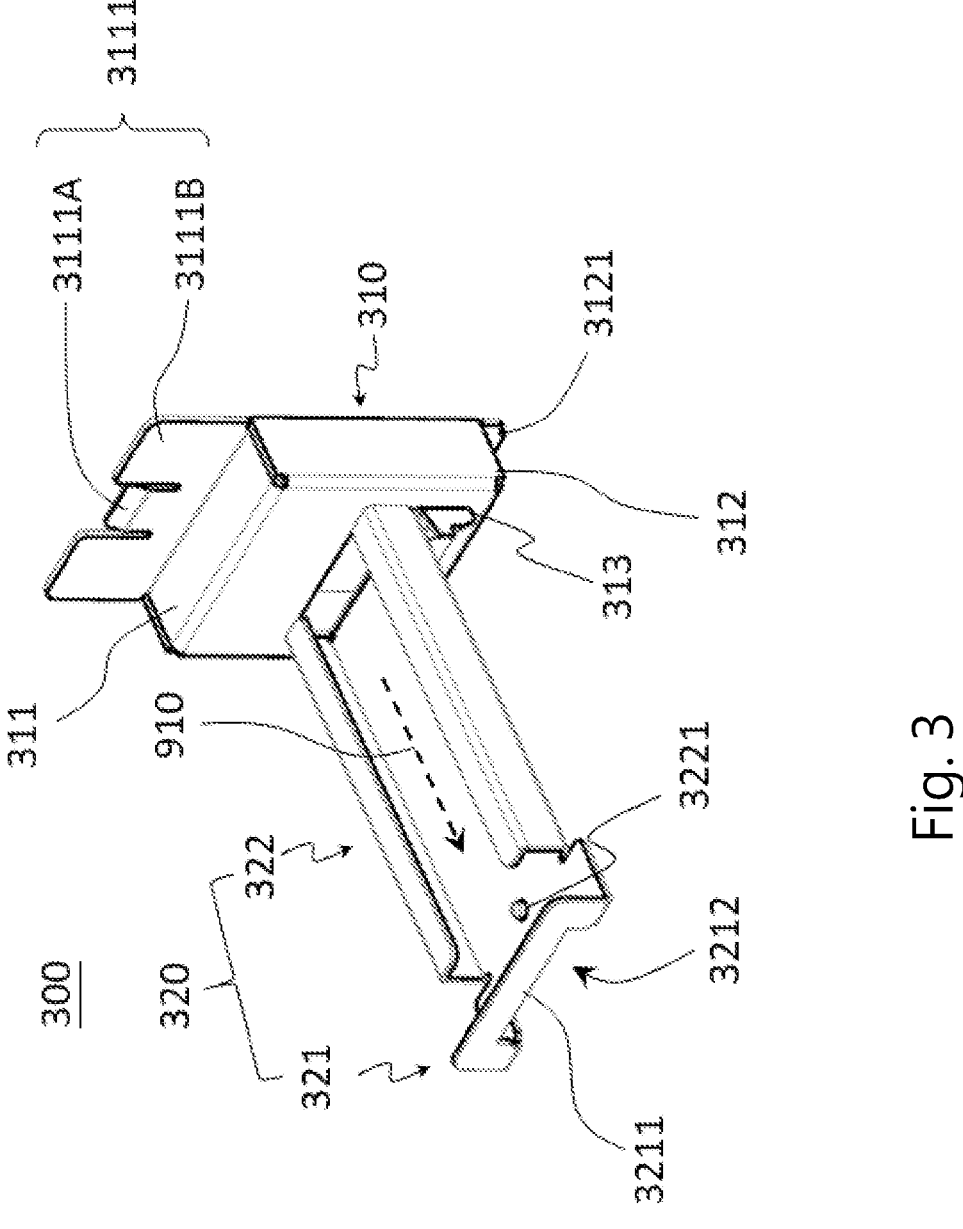
FIG. 3 is a schematic view showing an accommodating device for a memory module of the invention according to an embodiment.

Please refer to FIG. 3, which is a schematic view showing an accommodating device for a memory module of the invention according to an embodiment. As the embodiment in FIG. 3 shows, the accommodating device 300 comprises a first connecting portion 310 and a second connecting portion 320. The first connecting portion 310 can be connected to the case of the computing device (for example, the first connecting portion 310 can be connected to the inner wall of the case), and the second connecting portion 320 can be connected (for example, by contacting or resting against, but is not limited thereto) to the connector 140. Preferably, the second connecting portion 320 does not directly contact the mainboard, so as to avoid causing short circuits to the mainboard. The first connecting portion 310 has a first end portion 311 and a second end portion 312, and the accommodating device 300 can be connected and fixed to the case of the computing device through the first end portion 311 and/or the second end portion 312. The second connection portion 320 may comprise a guiding portion 322. More specifically, during the process of installing the memory device 400 to the accommodating device 300 through the installation opening, the memory device 400 can be guided by the guiding portion 322, so that the memory device 400 moves relative to the accommodating device 300 along the guiding portion 322 and connects to the connector of the computing device. Preferably, the guiding portion 322 can be in the form of a groove or has a groove shape to help guide the memory device, so that the memory device can move along the guiding portion.

In the embodiment shown in FIG. 3, the second connecting portion 320 of the accommodating device 300 may comprise a connector receiving portion 321, which has an opening portion 3212 and an opening upper end 3211. The connector of the computing device can pass through the opening portion 3212, so that the memory device can be detachably connected to the connector of the computing device. In one embodiment, the connector is provided on the mainboard (meaning that the mainboard comprises a connector), and the second connecting portion 320 of the accommodating device 300 can be connected (for example, by contacting or resting against, but is not limited thereto) to the connector through the opening upper end 3211. In this way, direct contact between the second connecting portion 320 and the mainboard can be avoided.

Figure 4:
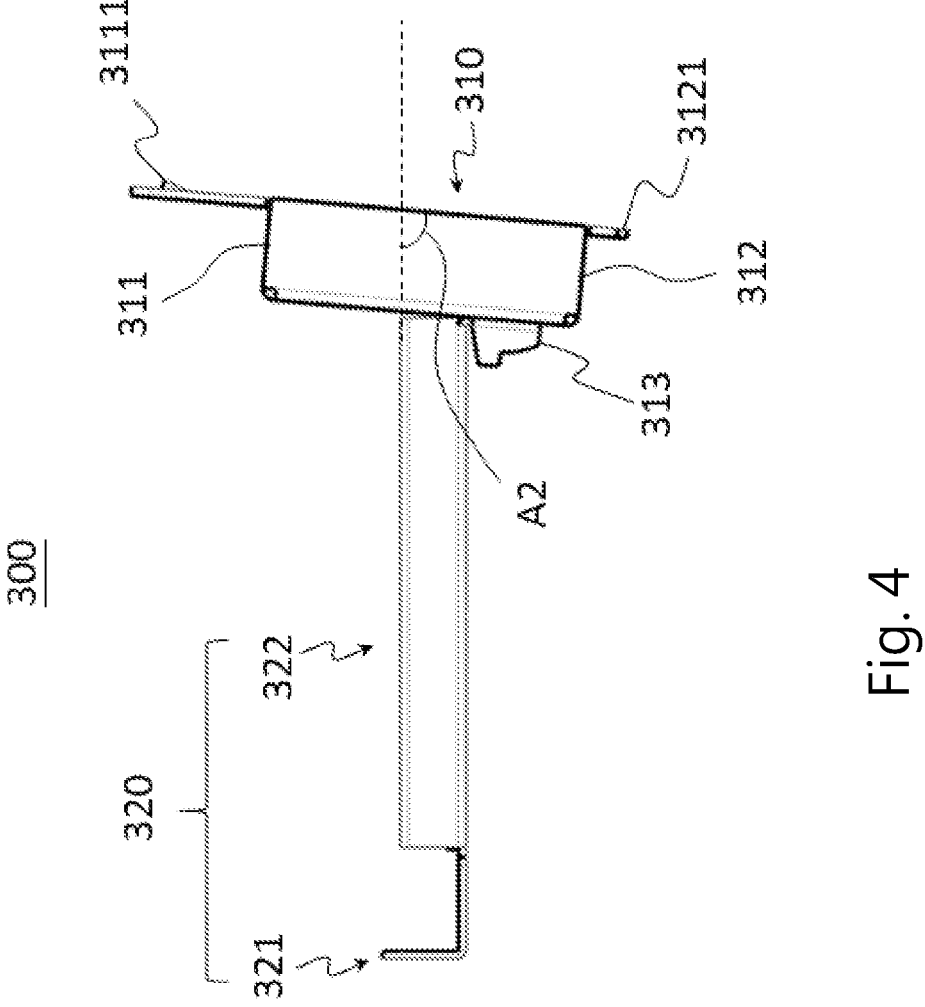
FIG. 4 is another schematic view showing the accommodating device for a memory module of the invention according to an embodiment.
Figure 5:
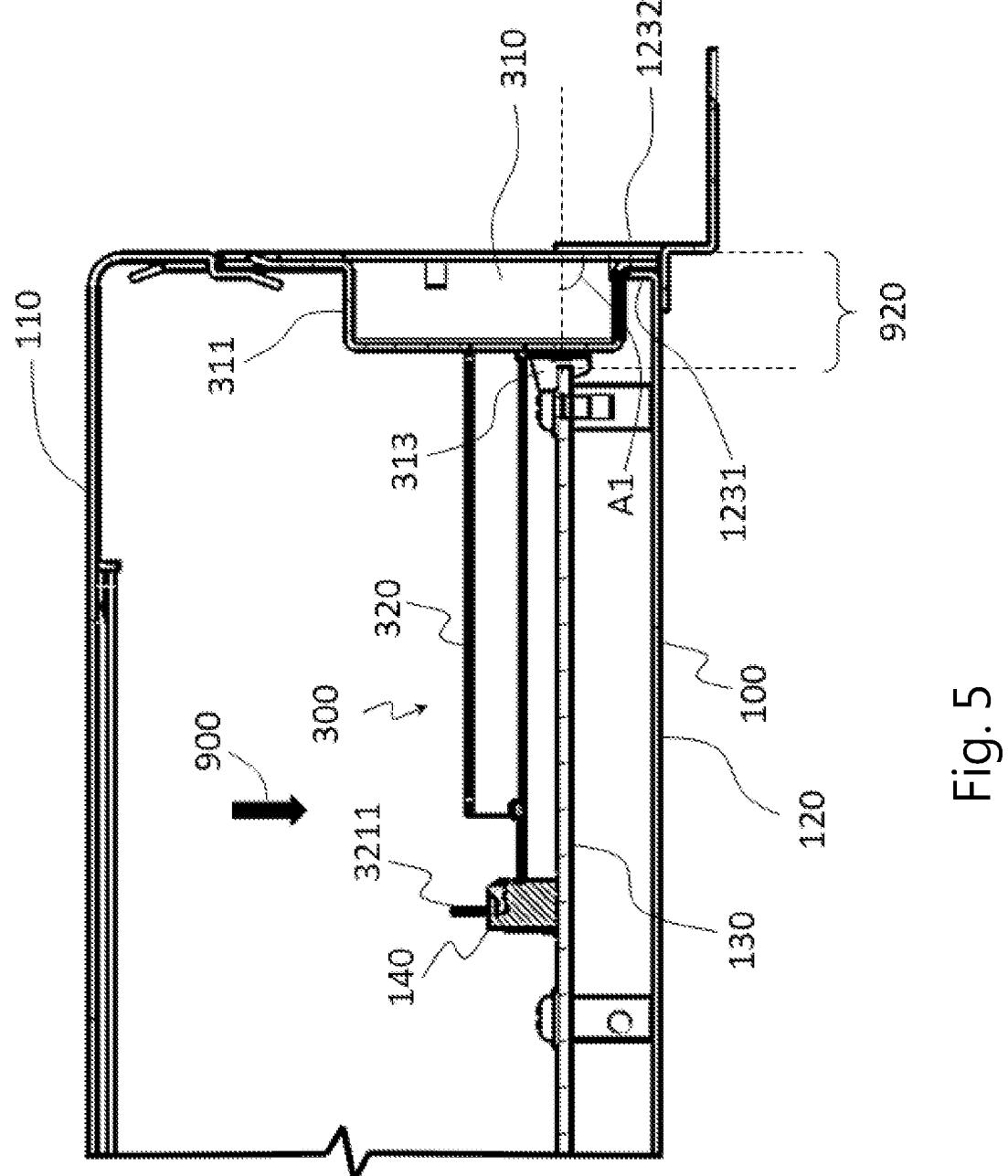
FIG. 5 is a schematic view showing an embodiment where the accommodating device is connected to the case and the mainboard.

Please refer to FIGS. 3-5, in which FIG. 4 is another schematic view showing the accommodating device for a memory module of the invention according to an embodiment, and FIG. 5 is a schematic view showing an embodiment where the accommodating device is connected to the case and the mainboard. As shown in FIGS. 3-5, the case 100 of the computing device comprises a positioning groove, the first connecting portion 310 comprises a protruding portion 3121 at the second end portion 312, and the second end portion 312 can be connected to the positioning groove of the case 100 (for example, the second end portion 312 can be accommodated in the positioning groove). In one embodiment, the case 100 comprises a first positioning protrusion 1231 and a second positioning protrusion 1232, and the groove defined between the first positioning protrusion 1231 and the second positioning protrusion 1232 becomes the positioning groove of the computing device.

In one embodiment, the first connecting portion 310 is disposed at least partially between the case 100 and the mainboard 130, and the first connecting portion 310 is connected to both the case 100 and the mainboard 130. In one embodiment, a gap section 920 is formed between the mainboard 130 and the case 100. At least a part of the first connecting portion 310 of the accommodating device 300 is secured by (or sandwiched between) the mainboard 130 and the case 100 to be located in the gap section 920. In one embodiment, the first connecting portion 310 of the accommodating device 300 may have an abutting portion 313, and the first connecting portion 310 can be connected to (for example, by abutting against) the notch portion of the mainboard through the abutting portion 313. In this way, the first connecting portion 310 of the accommodating device 300 can be correctly positioned on the mainboard by means of the notch portion.

In one embodiment, the accommodating device 300 may comprise a securing mechanism, and the accommodating device 300 and the case 100 may be secured to each other by means of the securing mechanism. In one embodiment, the securing mechanism of the accommodating device 300 is a screw mechanism, and the accommodating device 300 can be screwed to the case 100 by means of the screw mechanism. In one embodiment, the case 100 comprises a positioning hole 122 (the positioning hole 122 can be arranged as shown in FIG. 2), and the securing mechanism of the accommodating device 300 is made up of: The accommodating device 300 comprises a securing portion 3111 at the first end portion 311, and the securing portion 3111 can extend at least partially through the positioning hole 122, so that the first connecting portion 310 is positioned correctly. Preferably, the securing portion 3111 can abut at least partially against the upper portion of the positioning hole 122 (for example, the first portion 3111A of the securing portion 3111 can extend through the positioning hole 122 and abut against the upper portion of the positioning hole 122). In one embodiment, the case 100 comprises an upper case 110 and a lower case 120; the positioning hole 122 is disposed on the lower case 120, and the second end portion 312 of the accommodating device 300 is connected to the lower case 120. When the securing portion 3111 extends at least partially through the positioning hole 122 and the upper case 110 and the lower case 120 are connected to each other, the upper case 110 can contact and abut against the securing portion 3111 (for example, the first portion 3111A of the securing portion 3111 can extend through the positioning hole 122 and abut against the upper portion of the positioning hole 122; meanwhile, the upper case 110 can contact and abut against the second portion 3111B of the securing portion 3111). With this arrangement, the accommodating device 300 can be stably secured to the case 100.

In one embodiment, the case 100 and the mainboard 130 have a first angle A1 between them, and the first connecting portion 310 and the second connecting portion 320 have a second angle A2 between them, wherein the second angle A2 is smaller than the first angle A1. In this way, when the accommodating device 300 is connected to the case 100, the second connecting portion 320 can exert an external force on the mainboard 130 and/or the connector 140 in the direction 900, so that the second connecting portion 320 can be stably secured to the mainboard 130 and/or the connector 140. Preferably, the second connecting portion 320 does not directly contact the mainboard 130. In one embodiment, the second connecting portion 320 is connected to the connector 140 (for example, the connector 140 passes through the opening portion of the second connecting portion 320, and the opening upper end 3211 of the second connecting portion 320 contacts or abuts against the connector 140), and the connector 140 is connected to the mainboard 130. Through the connector 140, the second connecting portion 320 can exert an external force to the mainboard 130 in the direction 900.

In one embodiment, the memory module of the present invention may comprise a positioning mechanism, and the memory module uses the positioning mechanism to enable the memory device to move relative to the accommodating device 300 in a moving direction 910. In this way, the memory device can move in the correct direction (i.e., the moving direction 910) to connect to the connector. In one embodiment, the positioning mechanism is made up of: The memory device 400 has a guiding slot (e.g., the guiding slot 411 shown in FIG. 6), and the accommodating device 300 has a positioning portion 3221. When the memory device 400 moves relative to the accommodating device 300, the positioning portion 3221 moves in the moving direction 910 along the guiding slot. Preferably, the extending direction of the guiding slot is parallel to the moving direction 910. In one embodiment, the positioning portion 3221 is a protruding portion protruding outward from the surface of the accommodating device 300. During the movement of the memory device 400 relative to the accommodating device 300, the positioning portion 3221 is accommodated at least partially in the guiding slot. In another embodiment, the positioning mechanism of the memory module is made up of: The memory device has a positioning portion, and the accommodating device has a guiding slot. When the memory device moves relative to the accommodating device, the positioning portion moves in the moving direction along the guiding slot.

Figure 6:
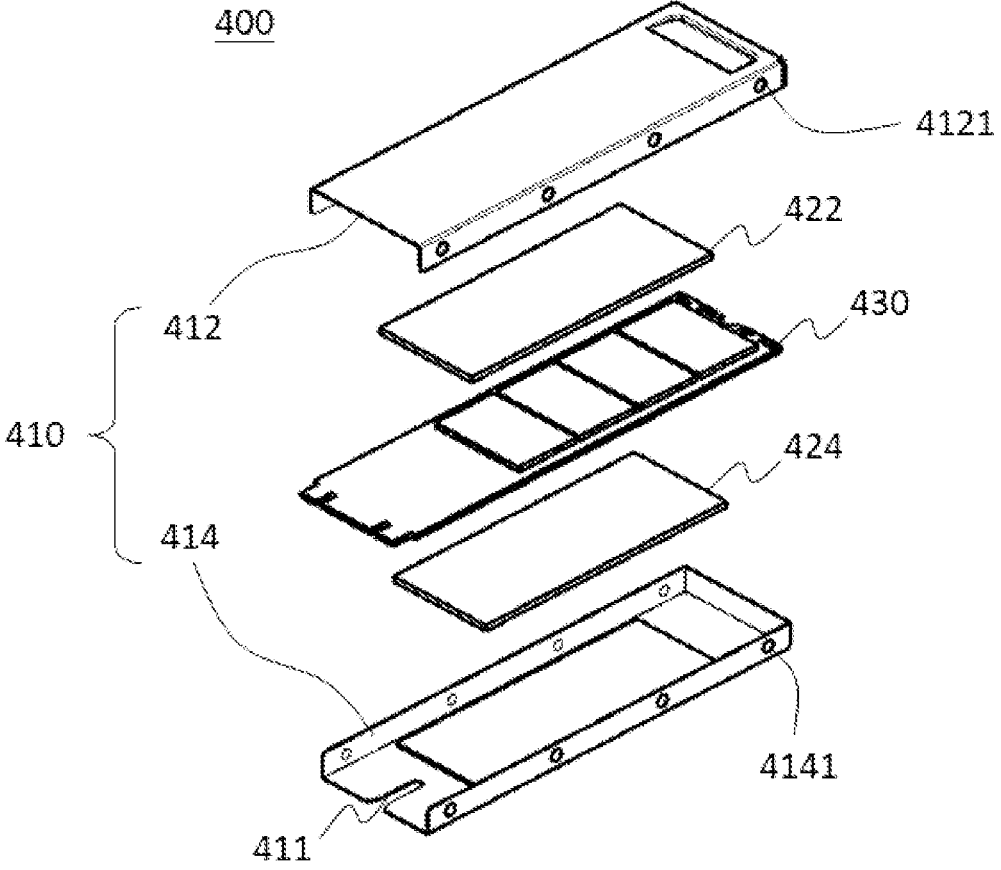
FIG. 6 is a schematic view showing a memory device for a memory module of the invention according to an embodiment.

FIG. 6 is a schematic view showing a memory device for a memory module of the invention according to an embodiment. In the embodiment shown in FIG. 6, the memory device 400 comprises a housing portion 410, heat conducting portions 422 and 424, and a memory portion 430. The heat conducting portions 422 and 424 and the memory portion 430 are disposed within the housing portion 410. Preferably, the heat conducting portions 422 and 424 contact the memory portion 430, and the heat conducting portions 422 and 424 can help conduct the heat generated by the memory portion 430 away (for example, the heat conducting portions 422 and 424 can help transfer the heat generated by the memory portion 430 to the housing portion 410, and then the heat can be transferred to the outside air through the housing portion 410. It should be understood that the number of heat conducting portions can be provided depending on the needs; for example, there can be one or more than two heat conducting portions. In one embodiment, the housing portion 410 may comprise a first housing 412 and a second housing 414, and the first housing 412 and the second housing 414 may be connected to each other to form the housing portion 410. Preferably, the first housing 412 can have one or more first housing connecting portions 4121, and the second housing 412 can have one or more second housing connecting portions 4141. And the first housing 412 and the second housing 414 can be connected to each other through the first housing connecting portions 4121 and the second housing connecting portions 4141. Preferably, one of the first housing connecting portion 4121 and the second housing connecting portion 4141 is a protrusion and the other is a recess (or a through hole), and the protrusion can be received in the recess (or the through hole).

In one embodiment, the housing portion 410 may have a guiding slot 411. When the memory device 400 moves relative to the accommodating device, the positioning portion of the accommodating device can move along the guiding slot 411. Preferably, the memory portion 430 can be an M.2 SSD (a small form factor solid-state drive for data storage, formerly known as the Next Generation Form Factor, NGFF).

Figure 7:
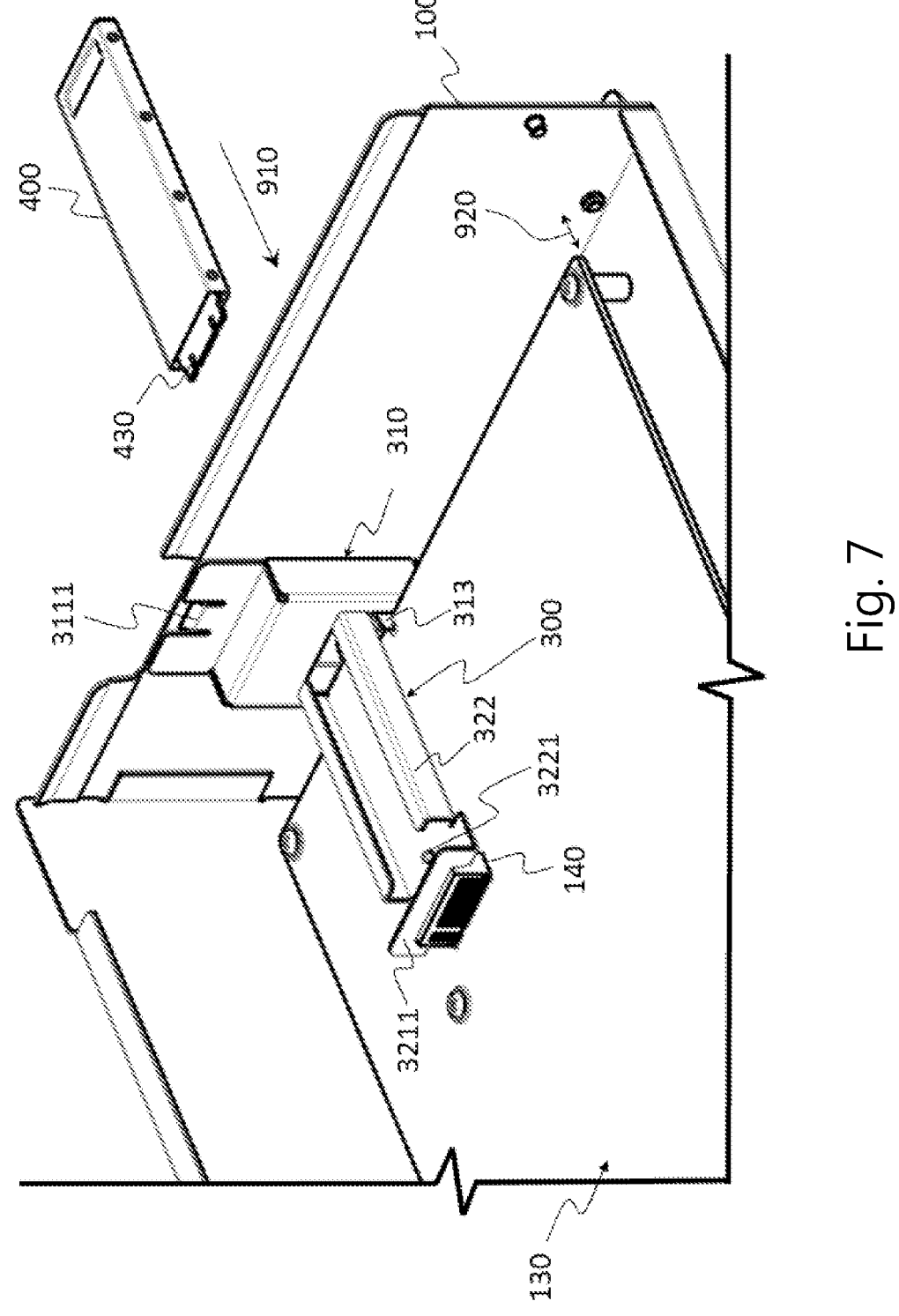
FIG. 7 is a schematic view showing an embodiment where a memory module of the invention is used in a computing device.

FIG. 7 is a schematic view showing an embodiment where a memory module of the invention is used in a computing device. In the embodiment shown in FIG. 7, the computing device comprises a case 100, a mainboard 130 and a connector 140. The case 100 is connected to the mainboard 130, and the connector 140 is disposed on the mainboard 130. The memory module comprises an accommodating device 300 and a memory device 400. The first connecting portion 310 of the accommodating device 300 is disposed partially in the gap section 920 between the case 100 and the mainboard 130. The abutting portion 313 of the accommodating device 300 is connected to the mainboard 130, and the securing portion 3111 of the accommodating device 300 extends at least partially through the positioning hole of the case 100. The connector 140 passes through the opening of the accommodating device 300, and the opening upper end 3211 of the accommodating device 300 contacts the connector 140. The user can connect or place the memory device 400 to/on the accommodating device 300 through the installation opening 121 of the case 100, and enables memory portion 430 of the memory device 400 to connect to the connector 140. In addition, the user can also remove the memory device 400 from the accommodating device 300 through the installation opening 121 as needed. By using the guiding portion 322 of the accommodating device 300, the positioning portion 3221 of the accommodating device 300 and the guiding slot of the memory device 400, the memory device 400 of the memory module can move relative to the accommodating device 300 along the moving direction 910.

The memory module of the present invention has been explained in detail by the above description and drawings. However, it should be understood that various embodiments of the present invention are only used for illustration. Various changes can be made without departing from the spirit and scope of the present invention, and such changes should be covered by the scope of the present invention. Therefore, the embodiments described herein are not intended to limit the present invention, and the true scope and spirit of the present invention are disclosed in the following claims.

What is claimed is:

1. A memory module for use in a computing device, the computing device comprising a case, a mainboard and a connector, the case having an installation opening, the memory module comprising:

an accommodating device connected to the mainboard and the case; and a memory device detachably disposed on the accommodating device through the installation opening and connected to the connector;

wherein the connector is disposed on the mainboard and connected to the mainboard, and the case and the mainboard have a first angle therebetween;

wherein the accommodating device has a first connecting portion and a second connecting portion, the first connecting portion connected to the case and the second connecting portion connected to the connector;

wherein the first connecting portion is connected to the second connecting portion;

wherein the first connecting portion and the second connecting portion have a second angle therebetween, the second angle being smaller than the first angle, so that the second connecting portion exerts an external force to the mainboard through the connector while the first connecting portion is connected to the case and the second connecting portion is connected to the connector;

wherein the second connecting portion abuts against the connector;

wherein the second connecting portion does not directly contact the mainboard.

2. The memory module of claim 1, wherein the accommodating device has a guiding portion, and the memory device moves relative to the accommodating device along the guiding portion and connects to the connector.

3. The memory module of claim 1, wherein the accommodating device has an opening portion, and the connector passes through the opening portion so that the memory device is detachably connected to the connector.

4. The memory module of claim 1, wherein the first connecting portion is disposed at least partially between the case and the mainboard, and the first connecting portion is connected to the case and the mainboard.

5. The memory module of claim 4, wherein the first connecting portion has an abutting portion, and the first connecting portion is connected to the mainboard through the abutting portion.

6. The memory module of claim 1, further comprising a positioning mechanism, wherein the memory module enables the memory device to move relative to the accommodating device in a moving direction by using the positioning mechanism.

7. The memory module of claim 6, wherein the positioning mechanism is made up of: the memory device has a guiding slot and the accommodating device has a positioning portion, wherein when the memory device moves relative to the accommodating device, the positioning portion moves in the moving direction along the guiding slot.

8. The memory module of claim 7, wherein the memory device comprises a housing portion, and the guiding slot is formed on the housing portion.

9. The memory module of claim 6, wherein the positioning mechanism is made up of: the memory device has a positioning portion and the accommodating device has a guiding slot, wherein when the memory device moves relative to the accommodating device, the positioning portion moves in the moving direction along the guiding slot.

10. The memory module of claim 1, wherein the accommodating device comprises a securing mechanism, and the accommodating device and the case are secured to each other by means of the securing mechanism.

11. The memory module of claim 10, wherein the securing mechanism is a screw mechanism, and the accommodating device is screwed to the case by means of the screw mechanism.

12. The memory module of claim 10, wherein the case has a positioning hole, and the securing mechanism is made up of: the accommodating device has a securing portion at a first end portion, and the securing portion extends at least partially through the positioning hole.

13. The memory module of claim 12, wherein the accommodating device has a protruding portion at a second end portion, and the protruding portion is connected to a positioning groove of the case.

14. The memory module of claim 1, wherein the memory device comprises a housing portion, a heat conducting portion and a memory portion, the heat conducting portion and the memory portion disposed within the housing portion, and the heat conducting portion contacting the memory portion.

\* \* \* \* \*